United States Patent
Park (10) Patent No.: US 6,717,961 B1
(45) Date of Patent: Apr. 6, 2004

(54) FORMAT CONVERTING APPARATUS AND DIGITAL BROADCASTING RECEIVER

(75) Inventor: Tae Joon Park, Seoul (KR)

(73) Assignee: LG Electronics, Inc., Seoul (KR)

( * ) Notice: Subject to any disclaimer, the term of this patent is extended or adjusted under 35 U.S.C. 154(b) by 0 days.

(21) Appl. No.: 09/461,775

(22) Filed: Dec. 15, 1999

(30) Foreign Application Priority Data

Dec. 31, 1998 (KR) .............................................. 98-62827

(51) Int. Cl.[7] .......................... H04J 3/02; H04N 11/20; H03L 1/52; H03D 1/24
(52) U.S. Cl. ..................... 370/538; 370/537; 348/441; 375/301; 375/321
(58) Field of Search ................................ 370/339, 340, 370/342, 343, 345, 465, 466, 498, 537, 538, 539, 540, 541, 542, 543; 348/388, 441; 375/300, 301, 320, 321

(56) References Cited

U.S. PATENT DOCUMENTS 5,598,415 A * 1/1997 Nuber et al. ................. 370/474
6,266,702 B1 * 7/2001 Darnell et al. .............. 709/236

* cited by examiner

*Primary Examiner*—Wellington Chin
*Assistant Examiner*—William Schultz
(74) *Attorney, Agent, or Firm*—Birch, Stewart, Kolasch & Birch, LLP (57) ABSTRACT

A format converting apparatus for a mutual data exchange between an IEEE 1394 serial bus and a VSB remodulator is disclosed. The present invention allows a conversion from a format of the IEEE 1394 to the VSB remodulator and also a conversion from a format of the VSB remodulator to the IEEE 1394. Therefore, digital equipment having both the IEEE 1394 and the VSB remodulator can be utilized without problem.

23 Claims, 10 Drawing Sheets

Background Art transport stream packets

FORMAT CONVERTING APPARATUS AND DIGITAL BROADCASTING RECEIVER

BACKGROUND OF THE INVENTION

1. Field of the Invention

The present invention relates to a format converting apparatus and more particularly to a format converting apparatus for exchanging data between a serial bus and a remodulator.

2. Discussion of Related Art

An Institute of Electrical and Electronics Engineers (IEEE) 1394 is one of the standards for a digital interface allowing a mutual connection between equipments. The IEEE 1394 provides a transmission technique or standard between digital equipments as developed by U.S.A. Apple Co. The IEEE 1394 also provides a new interface standard in which multimedia data can be transmitted and received at a high speed of 100 Mbps~1 Gbps by connecting communication instruments, computers and household electric appliances through a single network.

The IEEE 1394 is based on a remarkable bilateral nature and is recognized as a technique capable of leading the age of multimedia. Especially, the IEEE 1394 supports both an asynchronous transmission such as a printer or scanner which does not require a real time operation, and an isochronous transmission such as a motional image or sound which requires a real time operation. The IEEE 1394 also has a characteristic of transmitting data rapidly and with stability by connecting only one cable in series to a personal computer (PC), regardless of a size or number of peripheral equipments. Accordingly, the development of products and parts for computers and household electric appliances have been accelerated.

Figure 1:
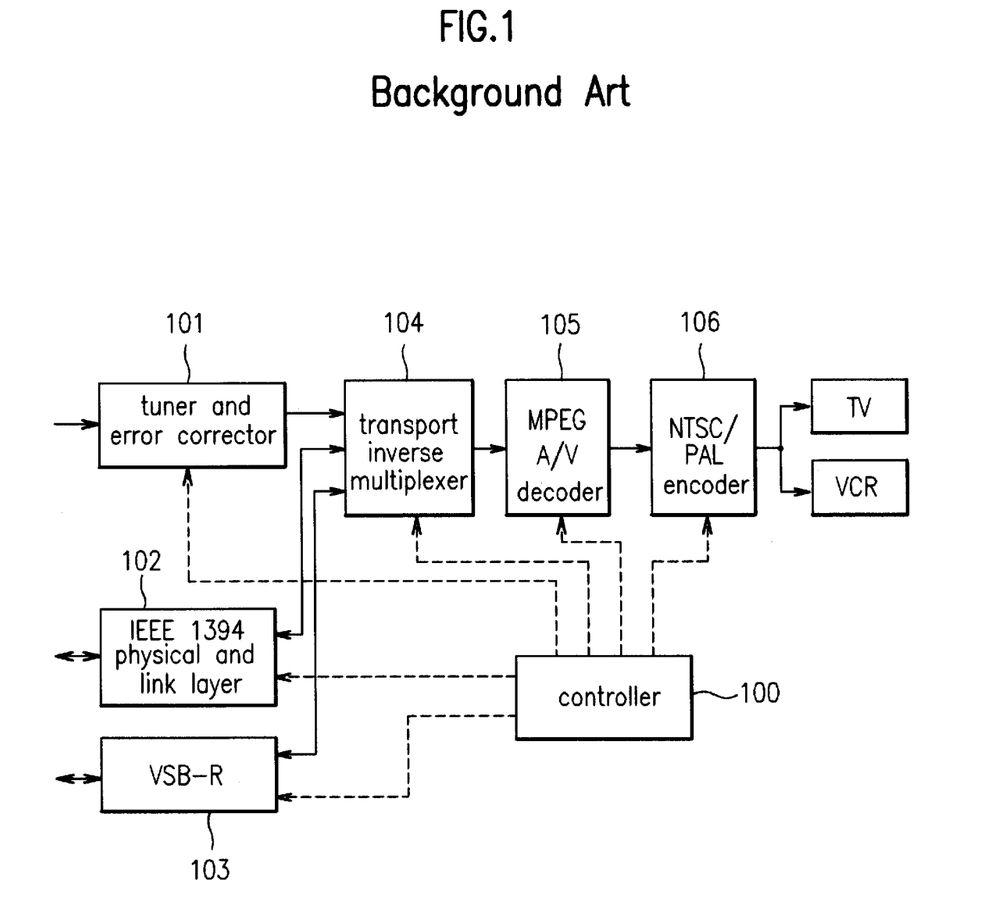
FIG. 1 is a block diagram of a digital broadcasting receiver in the related art.

FIG. 1 is a block diagram of a conventional digital broadcasting receiver utilizing the IEEE 1394. Referring to FIG. 1, a wireless signal is input through an antenna and is converted into a transport stream in a tuner and error corrector 101. After an error correction, the signal is output to a transport inverse multiplexer (MUX) 104. The transport stream inverse multiplexed into an audio and video (A/V) packetized elementary streams (PES) by the transport inverse MUX 104. A Moving Picture Experts Group Audio/Video (MPEG A/V) decoder 105 receives and decompresses the A/V PES. A NTSC/PAL encoder 106 converts the decompressed A/V data into an NTSC or PAL format and outputs the data to a TV or a video cassette recorder (VCR). A controller 100 controls the blocks above and performs functions such as a channel conversion according to inputs from a user. Such digital broadcasting receiver can selectively include one of an IEEE 1394 port 102 or a VSB-R port 103, or can include both.

The IEEE 1394 port 102 is defined by the standard of an IEEE standard 1394–1995 serial bus, and is embodied by implementing IEEE 1394 physical and link layers. As shown in FIG. 1, the IEEE 1394 port 102 is connected to the transport inverse MUX 104 and transmits the transport stream externally or outputs the externally received transport stream to the transport inverse MUX 104. The VSB-R port 103 is based on a data transmission system defined by the standard of an EIA-762 and EIA-761, and is embodied by implementing a VSB-R. The VSB-R port 103 is also connected to the transport inverse MUX 104 to transmit or receive the transport stream.

Figure 2:
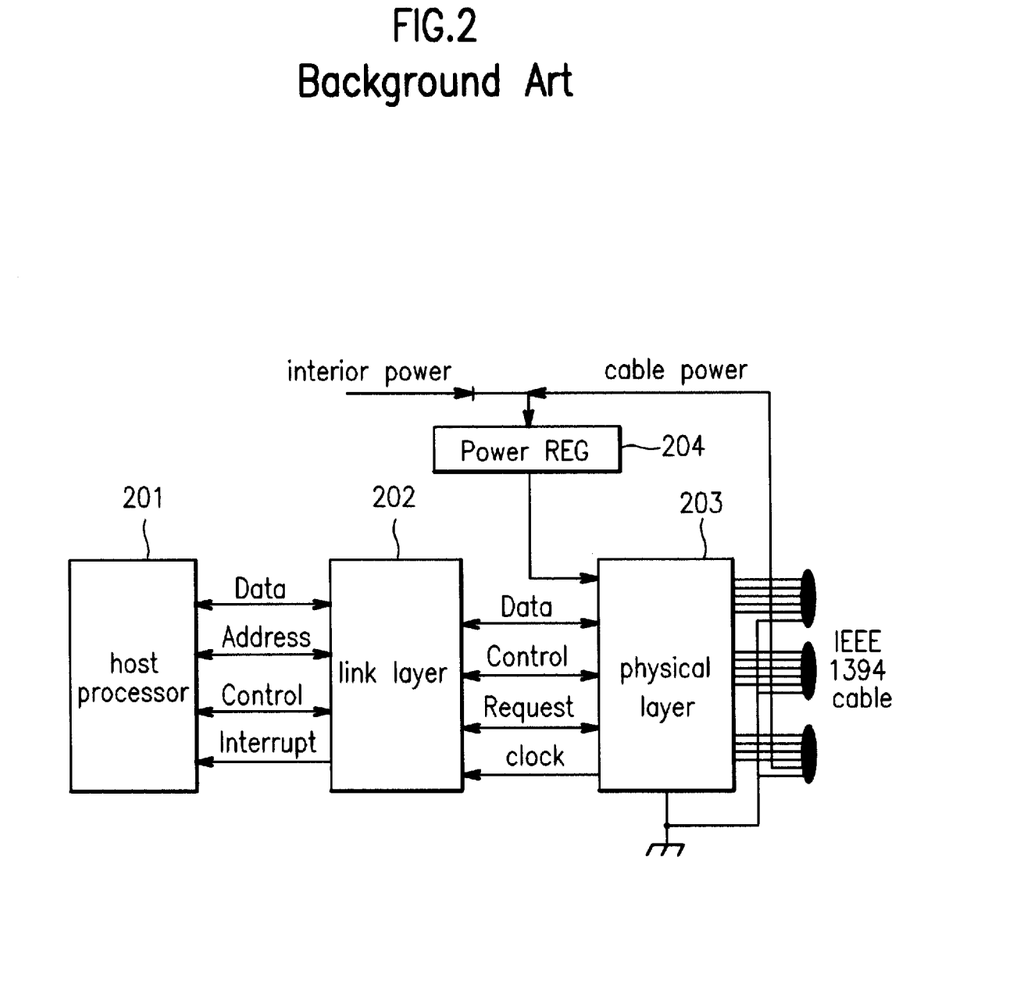
FIG. 2 is a block diagram showing an IEEE 1394 physical and link layers of FIG. 1.

FIG. 2 shows a block diagram of the IEEE 1394 physical and link layers (PHY and LINK layers) including a host processor 201 as a controller, a link layer 202, a physical layer 203 and an IEEE 1394 cable. The IEEE 1394 cable is provided as a physical unit used for forming a bus to exterior equipments. The physical layer 203 is connected to the IEEE 1394 bus utilizing the IEEE 1394 cable, loads transmission digital data on the IEEE 1394 bus and extracts data from the IEEE 1394 bus.

The digital data transferred by the bus is classified into either an isochronous data or an asynchronous data depending upon its attribute. The isochronous data is transferred through an isochronous channel by a constant transmission rate to ensure a real time transmission. The asynchronous data is transferred through an asynchronous channel and is particularly transmitted intermittently utilizing a spare bandwidth of the bus. In general the isochronous channel has a high data rate like the transport stream and is used for transmitting data necessary for a real time transmission, and the asynchronous channel is used for transmitting and receiving a control command between equipments.

The link layer 202 multiplexes the isochronous channel and the asynchronous channel so that the host processor 201 can separate the data into isochronous and asynchronous data to process the data. The host processor 201 controls the link layer 202 to transmit and receive the isochronous and asynchronous data. The IEEE 1394 can also be implemented as a network between the equipments.

Figure 3:
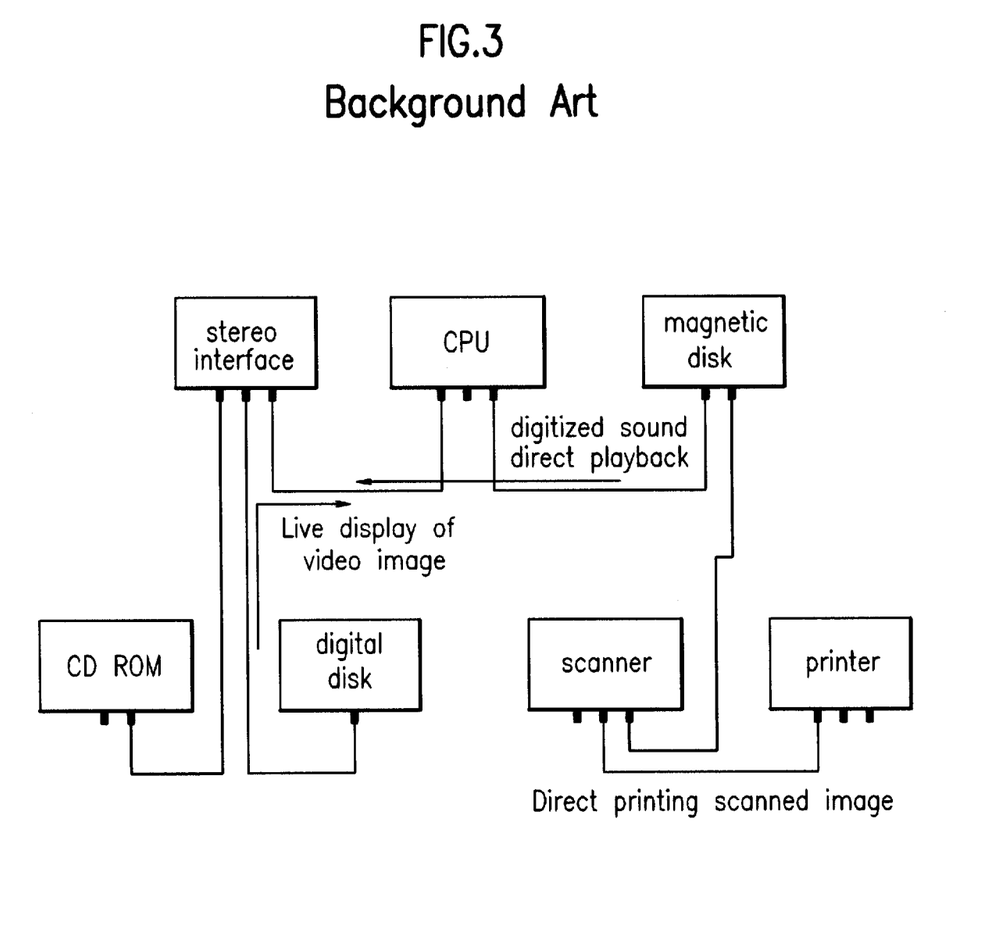
FIG. 3 shows the construction of a network using an IEEE 1394 serial bus of FIG. 2.

FIG. 3 is an example of a network utilizing the IEEE 1394 serial bus. For example, a digitized sound is transmitted as an isochronous data from a magnetic disk to a stereo interface, and a video image is transmitted as an isochronous data from a digital camera to a central process unit (CPU). Thus, two isochronous data are simultaneously transmitted between the stereo interface and the CPU. Such operation is available because the IEEE 1394 bus performs a multiplexation on the isochronous and asynchronous channels in a time-division multiplex structure as shown in FIG. 4.

Figure 4:
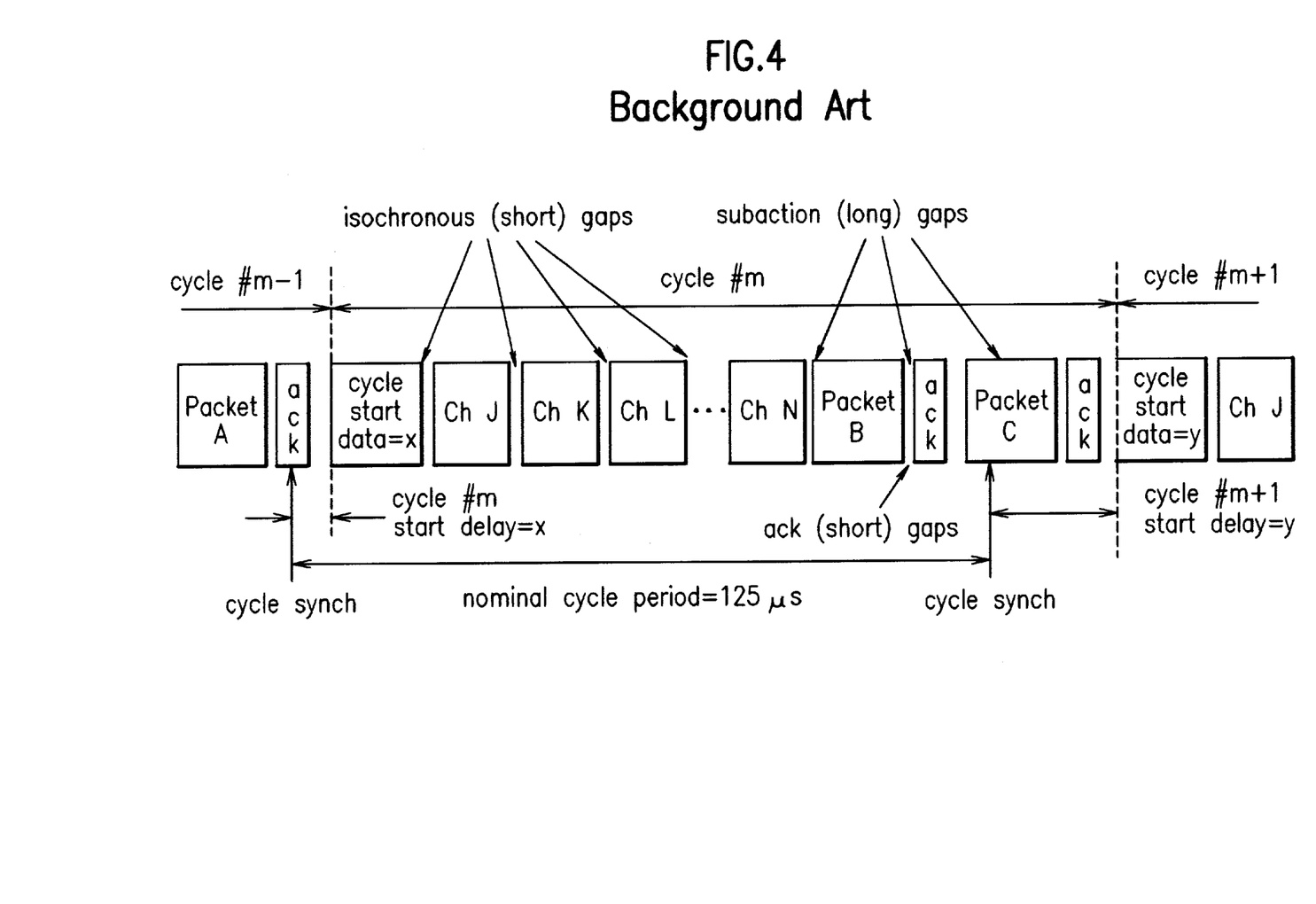
FIG. 4 shows a multiplex structure of the IEEE 1394 serial bus shown in FIG. 2.

The multiplexation in FIG. 4 is performed in cycles of 125 $\mu$s. Within each cycle, the isochronous channels must be transmitted according to a order of priority, and the asynchronous packets are transmitted in the remaining time.

Figure 5:
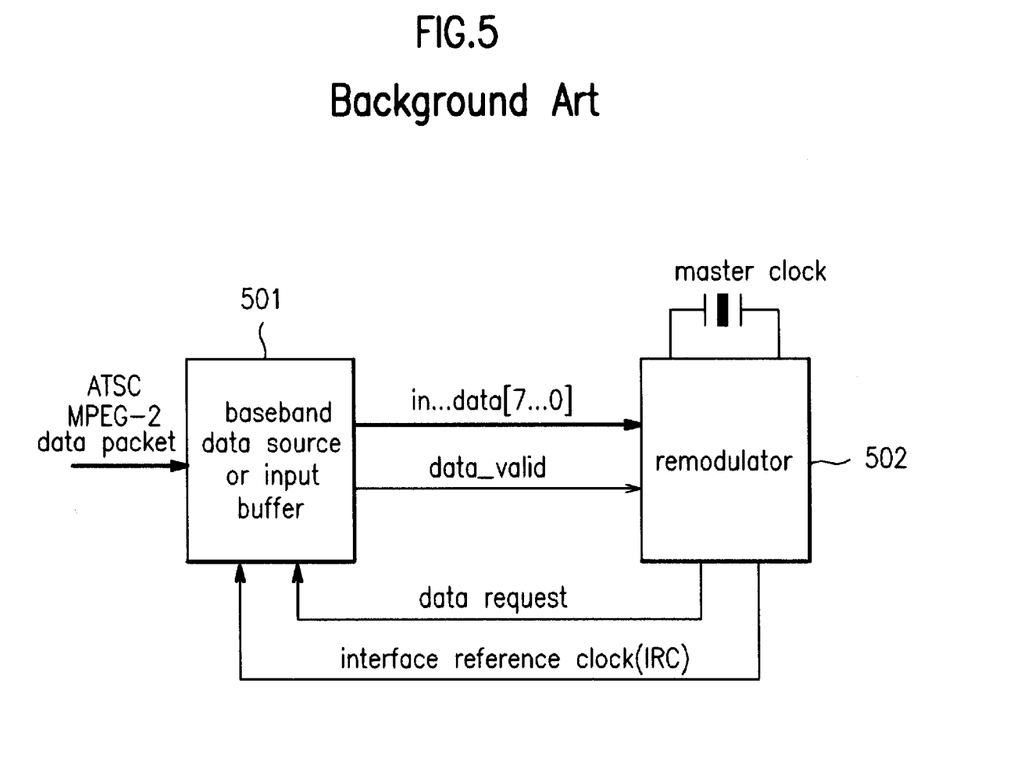
FIG. 5 is a block diagram of a VSB-remodulator of FIG. 1.

FIG. 5 is a block diagram of a typical VSB-R 102. A transport stream, ATSC MPEG-2 data packet, is input and stored in a buffer 501. The input transport stream is then transmitted to a remodulator 502 at a necessary point in time. The remodulator 502 performs a radio frequency (RF) modulation based on an 8 VSB or a 16 VSB system as defined in the ATSC standard A/53 annex D. Thus, the remodulator 502 receives data from the buffer 501 and executes the VSB modulation. The VSB modulated transport stream input at this time may be multiplexed with an On Screen Display (OSD) data.

Figure 6:
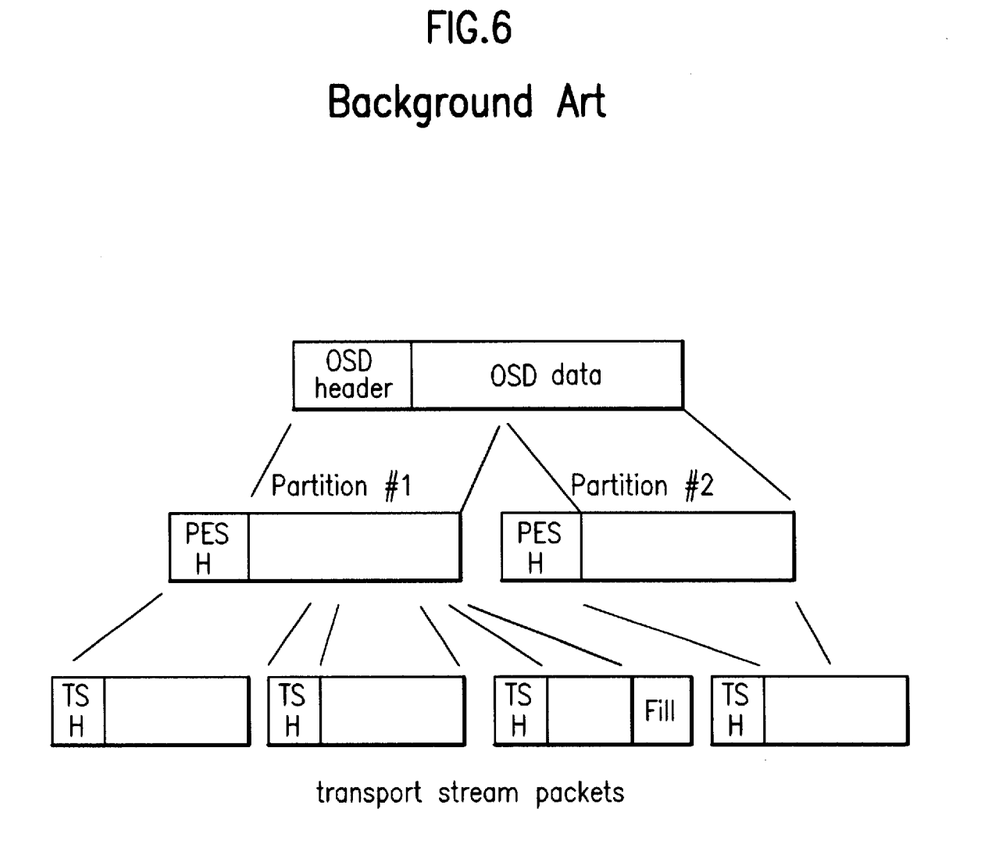
FIG. 6 is a multiplexation structure of OSD data provided by the standard of a VSB-remodulator of FIG. 5.

FIG. 6 shows a multiplexation structure of the OSD data defined in the VSB-R standard. The OSD data includes an OSD header and OSD data. Namely, the OSD header stores data such as a start position and size information of an OSD area, and palette information usable within the area. The OSD data stores bitmap information for all pixels provided within the OSD area. Thus the OSD data is converted into a packetized structure defined in the MPEG-2 standard. In other words, the OSD data is first packetized into a PES, and then re-packetized into a transport packet. Therefore, the OSD data is converted into a transport stream in two steps.

However, the digital apparatus of the future may require a several number of interface standards at the same time. As an example, the digital transmission standards of the IEEE 1394 and the VSB-R may be used in a digital broadcasting receiver as shown in FIG. 1. In such case, it is currently impossible to perform a data exchange between the IEEE 1394 and the VSB-R. Namely, data input through the IEEE 1394 cannot be output through the VSB-R, and vice versa. This incompatibility is largely caused by different data transmission speed of the IEEE 1394 (200 Mbps) and the VSB-R (38.8 Mbps) and is also caused by different OSD transmission systems, thereby making it difficult to directly exchange data.

Therefore, when the IEEE 1394 and the VSB-R are both implemented within one digital apparatus, data cannot be transmitted from the IEEE 1394 to an equipment connected to the VSB-R, or vice versa.

SUMMARY OF THE INVENTION

Accordingly, an object of the present invention is to solve at least the problems and disadvantages of the related art.

An object of the present invention is to provide a format converting apparatus capable of converting a format of input data to allow exchange of data between an IEEE 1394 serial bus and a VSB-R.

Another object of the present invention is to provide a format converting apparatus capable of converting data based on a format of the IEEE 1394 into a format appropriate for the VSB-R.

A further object of the present invention is to provide a format converting apparatus capable of converting data of the VSB-R format into a format proper for the IEEE 1394.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

To achieve the objects and in accordance with the purposes of the invention, as embodied and broadly described herein, a format converting apparatus is characterized by the selecting the isochronous and asynchronous channels from the received IEEE 1394 channels, extracting OSD information from the selected asynchronous channel and converting the information into an OSD transport stream format of a VSB-R standard, and multiplexing and transmitting an A/V transport stream included in the selected isochronous channel and the converted OSD transport stream to the VSB-R.

In the format converting apparatus, the data rates from the multiplexation of the A/V and the OSD transport streams are calculated. The result of the calculation is compared with a transmission bandwidth of the VSB-R. Thus, the data rates of the A/V transport stream and the OSD transport stream are lessened or increased according to the comparison result, and thereafter, the A/V and OSD transport streams are multiplexed.

The present format converting apparatus is further characterized by receiving an isochronous channel necessary for a transmission allocated by an IEEE 1394 serial bus, performing an inverse multiplexation of the output from the VSB-R and transmitting a separated A/V transport stream through the allocated isochronous channel, and converting the OSD transport stream into an asynchronous packet according to the standard of the IEEE 1394 and transmitting the packet through the asynchronous channel.

The format converting apparatus according to the present invention can be implemented in a digital equipment having both an IEEE 1394 and a VSB-R. Particularly, the present format converting apparatus can be implemented in a digital broadcasting receiver having both an IEEE 1394 and a VSB-R.

BRIEF DESCRIPTION OF THE ATTACHED DRAWINGS

The invention will be described in detail with reference to the following drawings in which like reference numerals refer to like elements wherein.

DETAILED DESCRIPTION OF PREFERRED EMBODIMENT

Reference will now be made in detail to the preferred embodiments of the present invention, examples of which are illustrated in the accompanying drawings.

Generally, the present invention includes selecting the isochronous and asynchronous channels from the received IEEE 1394 channels; extracting OSD information from the selected asynchronous channel and converting the OSD information into an OSD transport stream format of a VSB-R standard; multiplexing A/V transport streams of the selected isochronous channel and the converted OSD transport stream; and transmitting the multiplexed data to the VSB-R.

The present invention is also includes receiving an allocated isochronous channel necessary for a transmission from an IEEE 1394 serial bus; inverse multiplexing the output from the VSB-R and transmitting a separated A/V transport stream through the allocated isochronous channel; and converting the OSD transport stream into an asynchronous packet based according to the standard of the IEEE 1394 and transmitting the asynchronous packet through the asynchronous channel.

Figure 7:
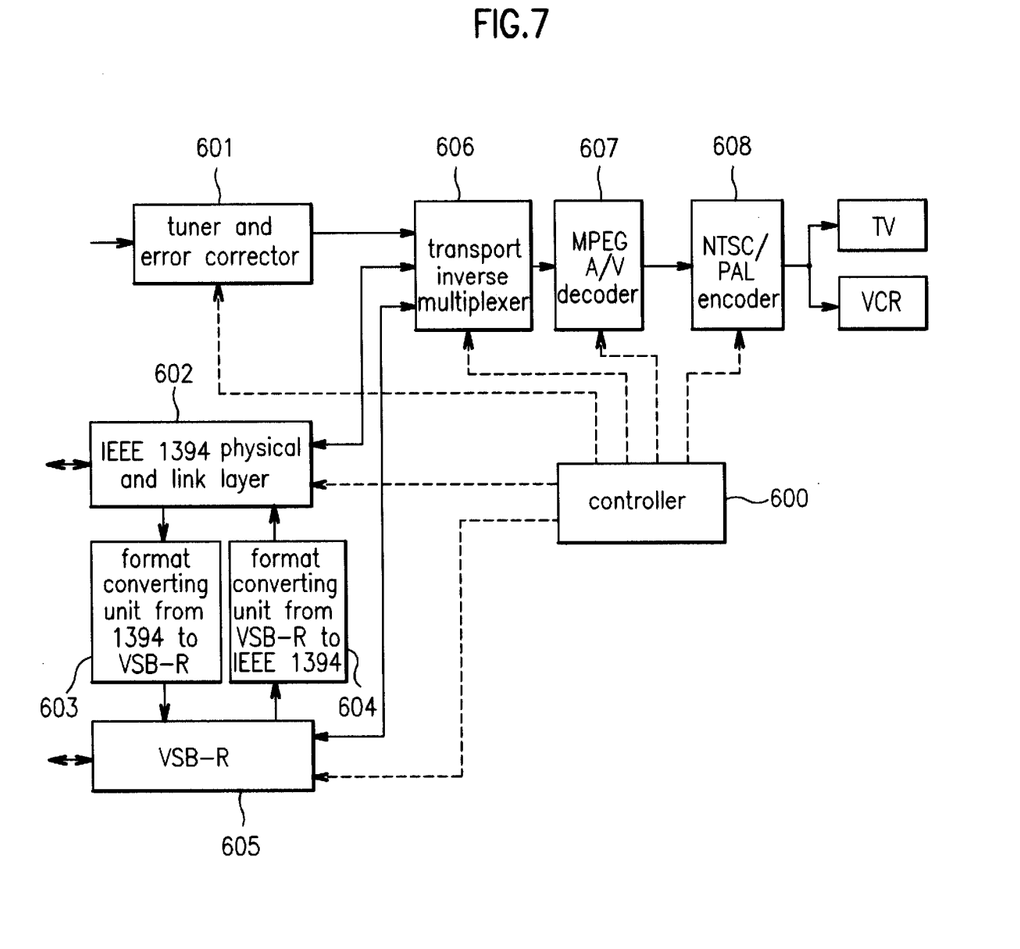
FIG. 7 is a block diagram of a digital broadcasting receiver having a format converting apparatus between an IEEE 1394 and a VSB-R in accordance with the present invention.

FIG. 7 is an overall block diagram of a digital broadcasting receiver according to the present invention including a format converting apparatus between the IEEE 1394 and the VSB-R. Particularly, the format converting apparatus is implemented by a format converting unit 603 for converting from the IEEE 1394 to the VSB-R and a format converting unit 604 for converting from the VSB-R to the IEEE 1394. The format converting apparatus is positioned between an IEEE 1394 physical and link layer 602 and a VSB-R 605, and performs a format conversion between the two interfaces. As blocks 600~601 and 606~608 respectively corresponds to the blocks 100~101 and 104~106 explained with reference to FIG. 1, a detailed description will be omitted.

Figure 8:
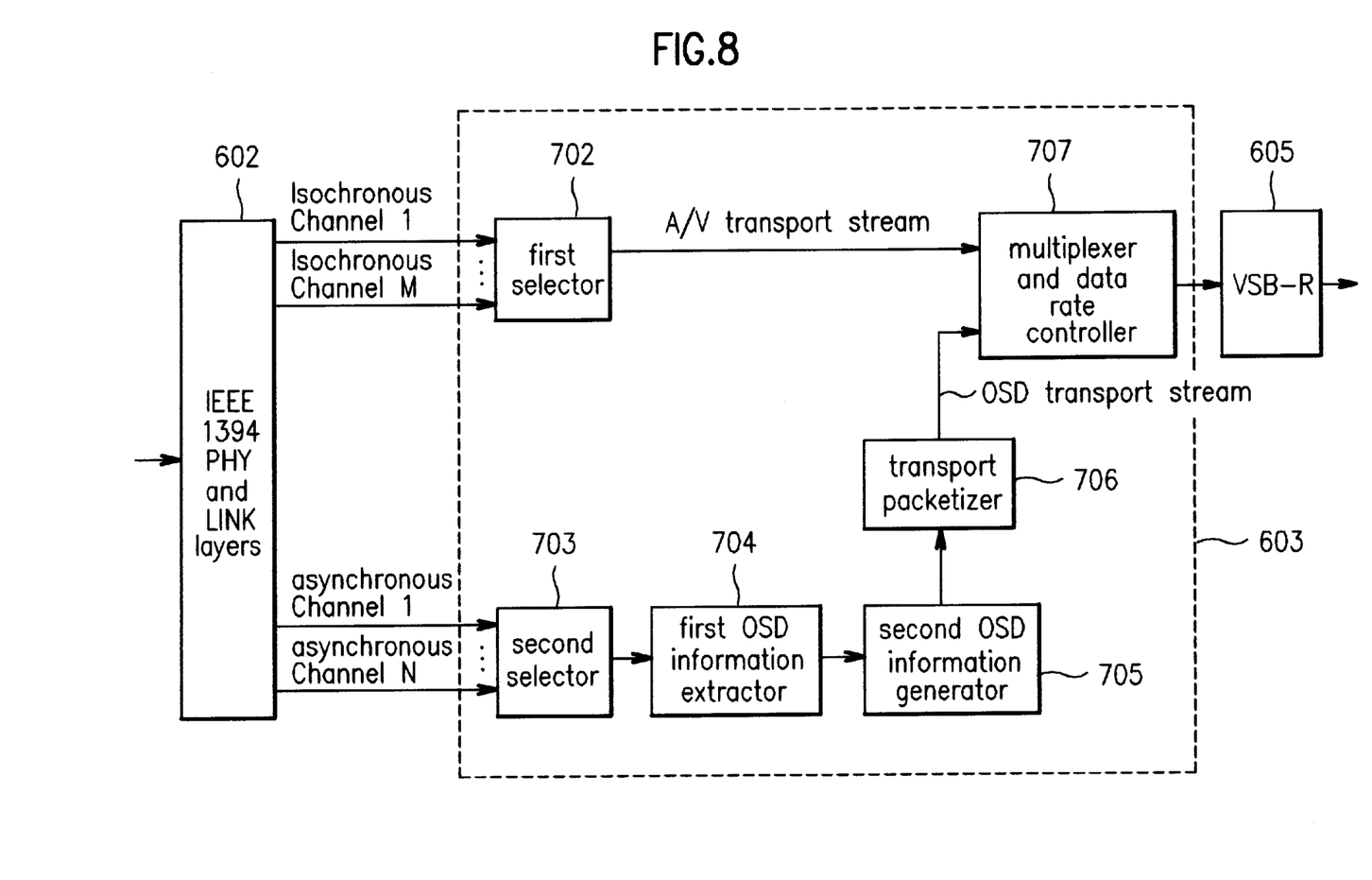
FIG. 8 is a block diagram of a first embodiment of a format converting unit in FIG. 7 for performing a format conversion from the IEEE 1394 to the VSB-R.

FIG. 8 is a block diagram showing the first embodiment of the format converting unit 603 for converting from the IEEE 1394 to the VSB-R. The format converting unit 603 includes a first selector 702 for selecting m number (m≧1) from M number of isochronous channels received through the IEEE 1394 physical and link layer 602 and multiplexing the selected m number of isochronous channels to output A/V transport stream; a second selector 703 for selecting n number (n≧1) from N number of asynchronous channels received through the IEEE 1394 physical and link layer 602 and outputting the selected n number of asynchronous channels; a first OSD information extractor 704 for analyzing control commands contained in the selected asynchronous channels of the second selector 703 and extracting OSD information; a second OSD information generator 705 for converting the extracted OSD information into a VSB-R format; a transport packetizer 706 for packetizing the OSD information of the VSB-R format into a transport packet structure; and a multiplexation and data rate controller 707 for multiplexing the A/V transport stream output from the first selector 702 and the OSD transport stream output from the transport packetizer 706. The multiplexation and data rate controller 707 also inserts stuffing bytes to match the multiplexed transport stream with a bandwidth of the VSB-R in case the data rate of the multiplexed stream is smaller than a transmission bandwidth of the VSB-R, and outputs the rate-controlled transport stream to the VSB-R 605.

Particularly, the IEEE 1394 serial bus allocates an optional number of the isochronous channels and the asynchronous channels within a permissible range of the bandwidth. Although the IEEE 1394 physical and link layer 602 outputs M number of isochronous channels and N number of asynchronous channels, the bandwidth of the VSB-R is limited in comparison with that of the IEEE 1394. Thus, less than the total number of channels output from the IEEE 1394 701 is selected within the permissible bandwidth of the VSB-R. Namely, the permissible bandwidth is 38.8 Mbps for the 16 VSB and 19.4 Mbps for the 8 VSB ground wave.

Accordingly, the first selector 702 selects m number from M number of isochronous channels. The selected isochronous channels are multiplexed and output to the multiplexation and data rate controller 707. The value of m is determined in consideration of a user's requirement and a permissible bandwidth of the VSB-R.

The second selector 703 selects the n number from N number of asynchronous channels and outputs the selected asynchronous channels to the first OSD extractor 704. The value of n is also determined in consideration of a user's requirement and a permissible bandwidth of the VSB-R.

The asynchronous channel is typically used for transmitting control commands between equipments connected to the IEEE 1394 bus. In the digital broadcasting receiver, for example, the asynchronous channel is used when a writing start command is transmitted before the A/V bit stream is transmitted to a recording equipment. The asynchronous channel may further be used to transmit the OSD information as a part of the control command.

Accordingly, the second selector 703 selects n number of asynchronous channels corresponding to m number of isochronous channels selected by the first selector 702, and outputs the selected asynchronous channels to the first OSD information extractor 704. The first OSD information extractor 704 receives the selected n number of asynchronous channels, analyzes the control commands, extracts the OSD related information as a first OSD information, and outputs the first OSD information to the second OSD information generator 705.

The second OSD information generator 705 converts the first OSD information into a second OSD information, namely as a VSB-R format, and outputs the second OSD information to the transport packetizer 706. In particular, the first OSD information is described using Graphical User Interface (GUI) elements defined in the control command, and the second OSD information includes an OSD header and an OSD bitmap. The OSD header defines information such as a start position or a size and a palette of an OSD on a screen and the OSD bitmap defines values of respective pixels within an OSD area. The second OSD information generator 705 thus analyzes the first OSD information and generates the corresponding OSD header and OSD bitmap.

Thereafter, the second OSD information from the second OSD information generator 705 is packetized into a transport packet by the transport packetizer and output to the multiplexation and data rate controller 707. Such packetizing procedure includes two steps. First, the OSD header and the OSD bitmap are encoded to a PES packet as defined by the VSB-R standard. Second, the PES packet is converted into a transport stream.

The multiplexation and data rate controller 707 then multiplexes the A/V transport stream from the first selector 702 and the OSD transport stream from the transport packetizer 706. The multiplexation and data rate controller 707 inserts stuffing bytes to match the multiplexed transport stream with a bandwidth of the VSB-R in case the data rate of the multiplexed transport stream is smaller than a transmission bandwidth of the VSB-R. The transport stream is then output to the VSB-R 605. Thus, the VSB-R 605 modulates and outputs the transport stream in a VSB system.

Figure 9:
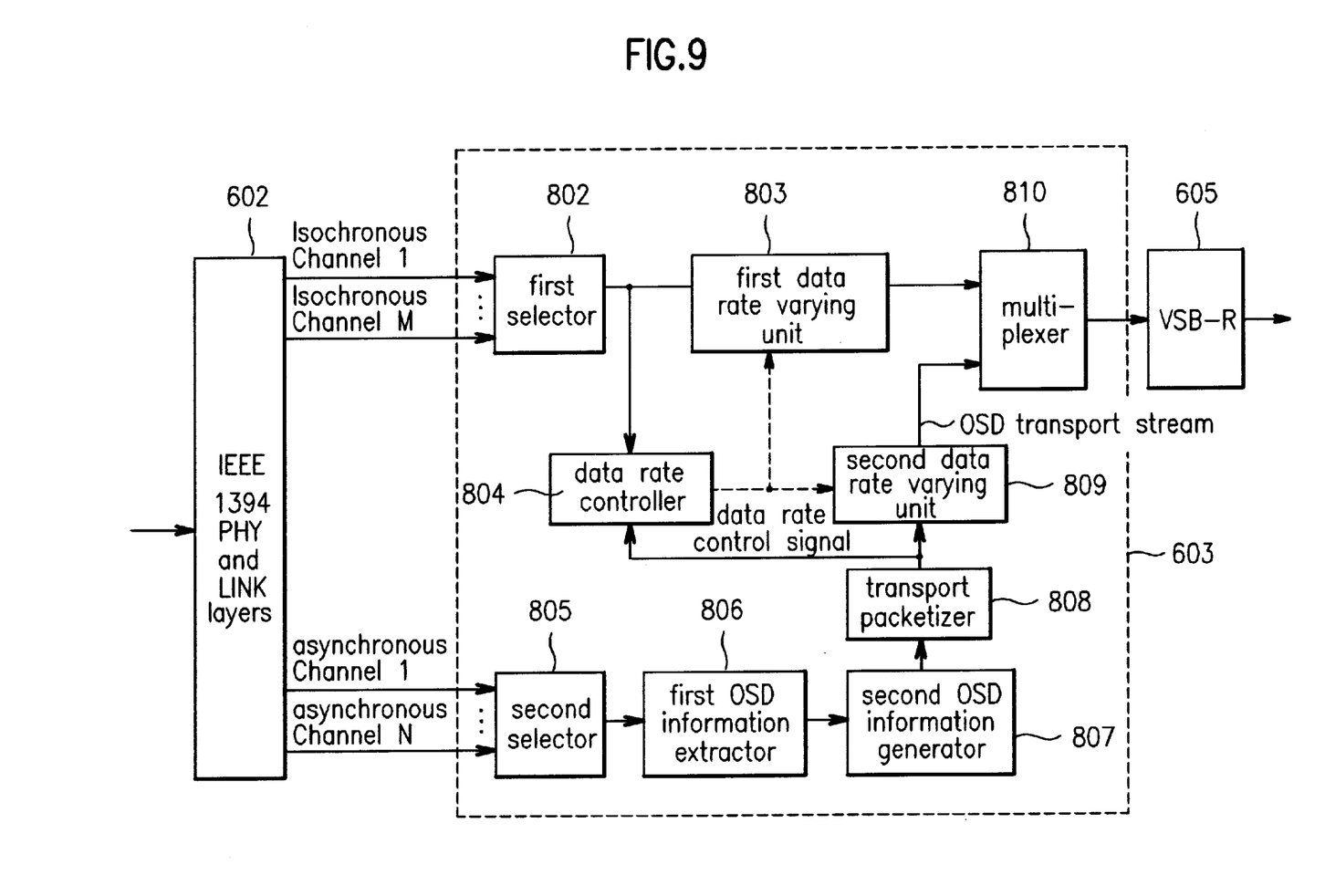
FIG. 9 is a block diagram of a second embodiment of a format converting unit in FIG. 7 for performing a format conversion from the IEEE 1394 to the VSB-R.

In the above embodiment, when the data rate of the multiplexed transport stream is smaller than the transmission bandwidth of the VSB-R, the stuffing bytes are inserted to match the rate to the VSB-R. However, if the data rate of the multiplexed transport stream is larger than the transmission bandwidth of the VSB-R, matching is not possible. Accordingly, FIG. 9 shows a second embodiment of the format converting unit 603 for converting from the IEEE 1394 to the VSB-R which cam reduce the data rate of the multiplexed transport stream.

The second embodiment of the format converting unit 603 also includes a first selector 802, a second selector 805, a first OSD information extractor 806, a second OSD information generator 807 and a transport packetizer 808. As the operation of blocks 802 and 805~808 respectively corresponds to the operation of blocks 702~706 described with reference to FIG. 8, a detailed description will be omitted. The difference between the first and second embodiment of the format converting unit 603 is that the second embodiment further includes a first data rate varying unit 803, a data rate controller 804, and a second data rate varying unit 809.

Particularly, the first data rate varying unit 803 is connected to the first selector 802 and the second data rate varying unit 809 is connected to the transport packetizer 808. The data rate controller 804 controls a data rate using the outputs from the first selector 802 and the transport packetizer 808, and a multiplexer 810 multiplexes the outputs of the first and second data rate varying units 803 and 809.

The first data rate varying unit 803 and the second data rate varying unit 809 are controlled by a data rate control signal generated by the data rate controller 804. Namely, the first data rate varying unit 803 reduces or increases the data rate of the A/V transport stream from the first selector 802, according to the data rate control signal, and outputs the rate controlled A/V transport stream to the multiplexer 810. To increase the data rate of the A/V transport stream, the method of inserting the stuffing bytes may be utilized and to reduce the data rate, a method of eliminating unnecessary information or less-important information may be utilized. For example, to reduce the data rate, information such as a subtitle and a teletext may be eliminated or information corresponding to an RF area of a video elementary stream may be eliminated.

The second data rate varying unit 809 reduces or increases the data rate of the OSD transport stream from the transport packetizer 808 according to the data rate control signal, and outputs the rate controlled OSD transport stream to the multiplexer 810. As in the first data rate varying unit 803, the method of inserting stuffing bytes may be used to increase the data rate of the OSD transport stream, and to reduce the data rate, a method of reducing the quantity of information. Namely, the quantity of information may be reduced by skipping a transmission of an OSD frame, i.e. the OSD header and bitmap for one screen, one time or reducing the number of colors used.

In order to control the data rates, the data rate controller 804 continuously computes what would be the data rate of a multiplexed A/V and OSD transport stream from the first selector 803 and the transport packetizer 808. The computed data rate is compared with the transmission bandwidth of the VSB-R 605. If the computed data rate is larger than the transmission bandwidth, the data rate controller 804 controls the first data rate varying unit 803 and the second data rate varying unit 809 to respectively reduce the data rates of the A/V and OSD transport stream. If the computed data rate is smaller, the data rate controller 804 controls the first data rate varying unit 803 and the second data rate varying unit 809 to respectively increase the data rate of the A/V and OSD transport stream.

Thus, when the outputs from the first and second data varying units 803 and 809 are multiplexed, the data rate should match the transmission bandwidth of the VSB-R 605. Accordingly, the multiplexer 810 multiplexes the A/V and OSD transport streams from the first and second data rate varying units 803 and 809, and outputs the multiplexed transport stream to the VSB-R 605.

As described above, in the format converting unit 603 for converting from a format of the IEEE 1394 to the VSB-R, an optional number of isochronous and asynchronous channels are selected from the channels output from the IEEE 1394. Thereafter, the OSD information transmitted through the selected asynchronous channel is extracted, the OSD information is converted into the OSD header and OSD bitmap and is encoded to the OSD transport stream. Finally, the A/V transport stream of the isochronous channel and the OSD transport stream are multiplexed. According to the present invention, the data rate of the multiplexed transport stream would match the bandwidth of the VSB-R. As a result, digital information of the IEEE 1394 bus is transmitted to the VSB-R.

Figure 10:
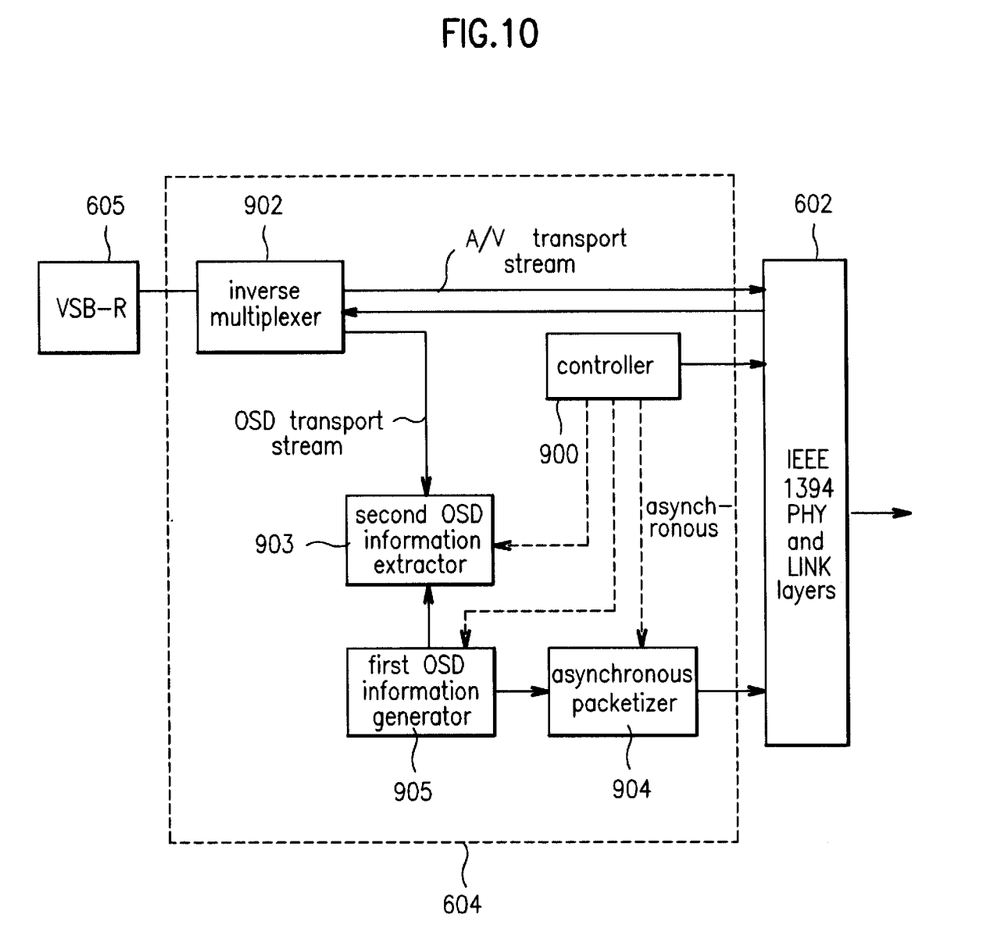
FIG. 10 is a block diagram of a format converting unit in FIG. 7 for performing a format conversion from the VSB-R to the IEEE 1394.

On the other hand, FIG. 10 is a block diagram showing the format converting unit 604 of FIG. 7 for converting from the VSB-R to the IEEE 1394. The format converting unit 604 includes an inverse multiplexer 902 for inverse multiplexing the transport stream from the VSB-R 605 and separating the transport stream into an A/V transport stream and an OSD transport stream; a second OSD information extractor 903 for analyzing the OSD transport stream and extracting OSD information; a first OSD information generator 905 for converting the extracted OSD information into an OSD information according to the standard of the IEEE 1394; an asynchronous packetizer 904 for multiplexing the converted OSD information with other control commands and packetizing the multiplexed data into an asynchronous packet; and a controller 900 for controlling the respective blocks to transmit the A/V transport stream from the inverse multiplexer 902 through the isochronous channel, and to transmit the asynchronous packet from the asynchronous packetizer 904 through the asynchronous channel.

Particularly, the inverse multiplexer 902 inverse multiplexes the transport stream output from the VSB-R 901 and separates the transport stream into the A/V transport stream and the OSD transport stream. The A/V transport stream is output to the IEEE 1394 physical and link layer 602 and the OSD transport stream is output to the second OSD information extractor 903.

The second OSD information extractor 903 analyzes the OSD transport stream, extracts a second OSD information and outputs the second OSD information to the first OSD information generator 905. The first OSD information generator 905 converts the second OSD information into a first OSD information and outputs the first OSD information to the asynchronous packetizer 904. As in the format converter 603, the second OSD information is in the format of the VSB-R and includes the OSD header and the OSD bitmap. Also, the first OSD information is described using the GUI elements defined in the control command. The asynchronous packetizer 904 then multiplexes the first OSD information with other control commands and packetizes the multiplexed data into the asynchronous packet.

The controller 900 controls blocks 903~904 to decide a maximum data rate of the A/V transport stream; to receive, from the serial bus, an allocation of the isochronous channel necessary for transmitting the A/V transport stream; to transmit the A/V transport stream from the inverse multiplexer 902 through the allocated isochronous channel; and to transmit the asynchronous packet from the asynchronous packetizer 904 through the asynchronous channel.

Thus, in the format converting unit 604 for converting from the format of the VSB-R to the IEEE 1394, an allocation of necessary number of isochronous channels is received from the serial bus; and the inverse multiplexed and separated A/V transport stream from the VSB-R is transmitted through the allocated isochronous channels. The inverse multiplexed and separated OSD transport stream from the VSB-R is converted into the first OSD information, is packetized into the asynchronous packet, and is transmitted through the asynchronous channel. As a result, digital information input by the VSB-R can be transmitted to the IEEE 1394 bus.

In sum, a format converting apparatus according to the present invention allows a mutual data exchange between an IEEE 1394 and a VSB-R. Therefore, utilized range of digital equipments such as a digital receiver and a digital recording playback equipment, which have both the IEEE 1394 and the VSB-R may be significantly enlarged, thereby increasing the convenience of users. Furthermore, since future digital equipments have a greater probability of simultaneously supporting several widely used interface standards, the capability of mutually exchanging data between the IEEE 1394 and the VSB-R as in the present invention would become more important. This mutual data exchange allows digital equipments to connect to either the IEEE 1394 or the VSB-R without restriction, thereby heightening a utilizable value of both interfaces.

In addition, different OSD formats of the IEEE 1394 and the VSB-R can be mutually converted such that the user interfaces become compatible. Finally, a data rate controlling function may also be provided in executing a conversion from the IEEE 1394 to the VSB-R, to optimize the transmission of data.

The foregoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A format converting apparatus for converting data of a first format structure into a second format structure, comprising:
    a first selector which selects m number from M number of received isochronous channels, where m≧1, and multiplexes the selected m number of isochronous channels;
    a second selector which selects n number from N number of received asynchronous channels, where n≧1, and outputs the selected n number of asynchronous channels;
    a format converter which analyzes control commands contained in the selected n number of asynchronous channels to extract OSD information, converts and packetizes the extracted OSD information into a transport packet structure; and
    a multiplexer which multiplexes the outputs from the first selector and the format converter, and outputs a multiplexed stream with a data rate matching a bandwidth of the second format structure.

2. An apparatus of claim 1, wherein the first format structure is based upon an IEEE 1394 serial bus, and the second format structure is based upon a VSB-remodulator.

3. An apparatus of claim 2, wherein values of m and n are determined in consideration of a user's requirement and a permissible bandwidth of the VSB-remodulator.

4. An apparatus of claim 1, wherein the format converter comprises:
    a first OSD information extractor which analyzes control commands contained in the selected n asynchronous channels and extracts OSD information;
    a second OSD information generator which converts the extracted OSD information into a second format structure; and
    a transport packetizer which packetizes the OSD information of the second format structure into the transport packet structure.

5. An apparatus of claim 4, wherein the OSD information extracted by the first OSD information extractor is described using graphical user interface elements defined in the control command.

6. An apparatus of claim 4, wherein the second OSD information generator analyzes the extracted OSD information and generates a corresponding OSD header and OSD bitmap.

7. An apparatus of claim 4, wherein the transport packetizer encodes the OSD header and the OSD bitmap into a PES and converts the PES packet into a transport stream.

8. An apparatus of claim 1, wherein the multiplexer matches the data rate of the multiplexed stream with the bandwidth of the VSB-remodulator by inserting stuffing bytes in the multiplexed stream, if the data rate of the multiplexed stream is smaller than a transmission bandwidth of the VSB-remodulator.

9. An apparatus of claim 1, further comprising:
    a first data rate varying unit which reduces or increases the data rate of the output from the first selector according to a first data rate control signal, and outputs a first rate controlled stream to the multiplexer;
    a second data rate varying unit which reduces or increases the data rate of the output from the format converter according to a second data rate control signal, and outputs a second rate controlled stream to the multiplexer; and
    a data rate controller which outputs the first and second data rate control signals based upon the outputs from the first selector and the format converter.

10. An apparatus of claim 9, wherein the first and second data rate varying units respectively increase the data rate of the outputs from the first selector and the format converter by inserting stuffing bytes.

11. An apparatus of claim 9, wherein the first data rate varying unit reduces the data rate of the output from the first selector by eliminating unnecessary information or unimportant information.

12. An apparatus of claim 11, wherein the first data rate varying unit eliminates a subtitle and a teletext or information corresponding to an RF area of a video elementary stream to reduce the data rate.

13. An apparatus of claim 9, wherein the second data rate varying unit reduces the data rate of the output from the format converter by reducing a quantity of information.

14. An apparatus of claim 13, wherein the second data rate skips a transmission of an OSD frame or reduces a number of colors used in order to reduce the data rate.

15. An apparatus of claim 9, wherein the data rate controller continuously computes what would be a data rate of a multiplexed stream using the outputs from the first selector and the format converter, and compares the computed data rate with the bandwidth of the second format structure to output the first and second data rate control signals.

16. A format converting apparatus for converting data of a first format structure into a second format structure, comprising:
    an inverse multiplexer which inverse multiplexes a received transport stream and separates the transport stream into an A/V transport stream and an OSD transport stream;
    an OSD information extractor which analyzes the OSD transport stream and extracts OSD information;
    a format converter which converts the extracted OSD information into an OSD information according to the second format structure, multiplexes the converted OSD information with other control commands, and packetizes the multiplexed stream into an asynchronous packet; and
    a controller which transmits the A/V transport stream from the inverse multiplexer through an isochronous channel and transmits the asynchronous packet from the format converter through an asynchronous channel.

17. An apparatus of claim 16, wherein the first format structure is based upon a VSB-remodulator, and the second format structure is based upon an IEEE 1394 serial bus.

18. An apparatus of claim 16, wherein the OSD information extracted by the OSD extractor includes the OSD header and the OSD bitmap and wherein the format converter converts the OSD information extracted by the OSD information extractor into information described using GUI elements defined in the control command.

19. An apparatus of claim 16, wherein said controller decides a maximum data rate of the A/V transport stream, receives an allocation of isochronous channels necessary for transmitting the A/V transport stream, transmits the A/V transport stream from the inverse multiplexer through the allocated isochronous channel, and transmits the asynchronous packet from the format converter through the asynchronous channel.

20. An apparatus of claim 16, wherein the format converter comprises:
   an OSD information generator which converts the extracted OSD information into an OSD information according to the second format structure; and
   an asynchronous packetizer which multiplexes the converted OSD information with other control commands and packetizes the multiplexed data into an asynchronous packet.

21. A digital broadcasting receiving set comprising:
   a receiver which processes an input signal and outputs a transport stream;
   an inverse multiplexer which inverse multiplexes and separates the transport stream into an A/V PES;
   an IEEE 1394 physical and link layer which transmits the transport stream externally or outputs an externally received transport stream to the inverse MUX;
   a VSB-R which modulates and transmits the transport stream externally or modulates and outputs an externally received transport stream to the inverse MUX;
   a first format converting unit which converts data from the IEEE 1394 physical and link layer to a data structure according to the VSB-R; and
   a second format converting unit which converts data from the VSB-R to a data structure according to the IEEE 1394 physical and link layer.

22. An apparatus of claim 21, wherein the first format converting unit includes:
   a first selector which selects m number from M number of isochronous channels received through the IEEE 1394 physical and link layer, where m≧1, and multiplexes the selected m number of isochronous channels to output A/V transport stream;
   a second selector which selects n number from N number of asynchronous channels received through the IEEE 1394 physical and link layer, where n≧1, and outputs the selected n number of asynchronous channels;
   a format converter which analyzes control commands contained in the selected n number of asynchronous channels to extract OSD information, converts and packetizes the extracted OSD information into a data structure according to the VSB-R and
   a multiplexer which multiplexes the outputs from the first selector and the format converter, and outputs a multiplexed stream with a data rate matching a bandwidth of the VSB-R.

23. An apparatus of claim 21, wherein the second format converting unit comprises:
   an inverse multiplexer which inverse multiplexes a transport stream from the VSB-R and separates the transport stream into an A/V transport stream and an OSD transport stream;
   an OSD information extractor which analyzes the OSD transport stream and extracts OSD information;
   a format converter which converts the extracted OSD information into an OSD information according to the data structure of the IEEE 1394 physical and link layer, multiplexes the converted OSD information with other control commands, and packetizes the multiplexed stream into an asynchronous packet; and
   a controller which transmits the A/V transport stream from the inverse multiplexer through an isochronous channel and transmits the asynchronous packet from the format converter through an asynchronous channel.

\* \* \* \* \*